United States Patent [19]

Cupo et al.

[11] Patent Number: 4,843,581
[45] Date of Patent: Jun. 27, 1989

[54] DIGITAL SIGNAL PROCESSOR ARCHITECTURE

[75] Inventors: Robert L. Cupo, Eatontown; Cecil W. Farrow, Highlands, both of N.J.

[73] Assignees: American Telephone and Telegraph Company, New York, N.Y.; AT&T Information Systems Inc., Morristown, N.J.

[21] Appl. No.: 48,189

[22] Filed: May 11, 1987

[51] Int. Cl.$^4$ ............................................. G06F 15/31
[52] U.S. Cl. ............................ 364/724.01; 364/724.16
[58] Field of Search ...................... 364/724.01, 724.16, 364/736

[56] References Cited

U.S. PATENT DOCUMENTS

| | | | |
|---|---|---|---|
| 4,064,397 | 12/1977 | Sakaki et al. | 364/724 |
| 4,344,149 | 8/1982 | van de Meeberg et al. | 364/724 |
| 4,393,456 | 7/1983 | Marshall, Jr. | 364/724 |
| 4,630,299 | 12/1986 | Welles, II et al. | 364/724 |

OTHER PUBLICATIONS

K. Lamb, "CMOS DSP Building Blocks Adjust Precision Dynamically", Electronic Design, Oct. 30, 1986, pp. 96–103.
R. Owen, "ECL MAC Slashes System Processing Times by 80%", Electronic Design, Oct. 30, 1986, pp. 108–115.
J. Cates et al., "DSP Chip Trio Links High-Level Hardware and Software", Electronic Design, Oct. 30, 1986, pp. 119–124.
N. Ichiura et al., "DSP IC Cranks Out 22-Bit Numbers at 20 MFLOPS", Electronic Design, Oct. 30, 1986, pp. 131–138.
T. Smith et al., "Cascadable DSP Chip Attacks Tasks With Parallel Punches", Electronic Design, Oct. 30, 1986, pp. 145–150.
T. Suziki et al., "Fixed-Point DSP Chips Offer a Low-Cost Alternative", Electronic Design, Oct. 30, 1986, pp. 157–160.
J. Boddie, "DSP Overview: The Device, Support Facilities, and Applications", The Bell System Technical Journal, vol. 60, No. 7, Sep. 1981, pp. 1431–1439.
F. Barber et al., "An Overview of the Silicon VLSI Implementation", The Bell System Technical Journal, vol. 60, No. 7, Sep. 1981, pp. 1441–1447.
J. Boddie et al., "DSP: Architecture and Performance", The Bell System Technical Journal, vol. 60, No. 7, Sep. 1981, pp. 1449–1462.

*Primary Examiner*—Gary V. Harkcom
*Assistant Examiner*—Long T. Nguyen
*Attorney, Agent, or Firm*—Frederick B. Luludis

[57] ABSTRACT

The computational processing power of a Digital Signal Processor (DSP) in linear-phase Finite Impulse Response Filter (FIR) applications is essentially doubled by taking advantage of either the even (symmetrical) or odd (antisymmetrical) symmetry of the response of such a filter.

8 Claims, 2 Drawing Sheets

DIGITAL SIGNAL PROCESSOR ARCHITECTURE

FIELD OF THE INVENTION

The invention relates to an improved architecture for a digital signal processor in linear-phase finite impulse response filter applications.

BACKGROUND OF THE INVENTION

Digital signal processing includes the generation, filtering and detection of digital signals. Special purpose computers, commonly referred to as Digital Signal Processors (DSPs), were specially designed to handle this type of signal processing. One problem associated with using a Digital Signal Processor in Finite Impulse Response (FIR) filter applications is the large amount of processing overhead that is incurred in generating the output response of such a filter. For example, a DSP performs, inter alia, 16 multiplications to generate the impulse response of a 16-stage FIR filter. This processing overhead translates into a reduction in the amount of real-time that a DSP can allocate to performing other signal processing functions. Prior DSP arrangements deal with this overhead problem by processing signals in parallel, i.e., they split up the number of multiplications among a plurality of multiplier circuits, which are expensive. Thus, while this approach appears to reduce the processing overhead in FIR filter applications, it does so at the expense of significantly increasing the cost of the DSP.

Other prior arrangements deal with this overhead problem by speeding up the system clock to reduce the amount of time that is used to perform a multiplication. However, this solution is far from ideal since the signal degrading effect of parasitic capacitances increases at higher clock rates.

SUMMARY OF THE INVENTION

In our arrangement, the number of multiplications that normally need to be done in finite impulse response filter applications is reduced by a factor of two by, in accordance with the invention, combining the signal components into pairs of signal components based on the order in which the signal components are received. Each such pair of components is then multiplied by a respective tap coefficient and the product of each such multiplication is accumulated to form a digitally filtered representation of the signal components.

Specifically, when the response of the such a filter is to be symmetrical, the signal components in each of the combinations are summed and when the response is to be antisymmetrical, one component is subtracted from the other in each of the combinations. As an aspect of the invention, a nonsymmetrical response may be generated by using both types of combinations and multiplying them by respective tap coefficients. However, in this case the number of multiplications that need to be done is not reduced.

DETAILED DESCRIPTION

Figure 2:
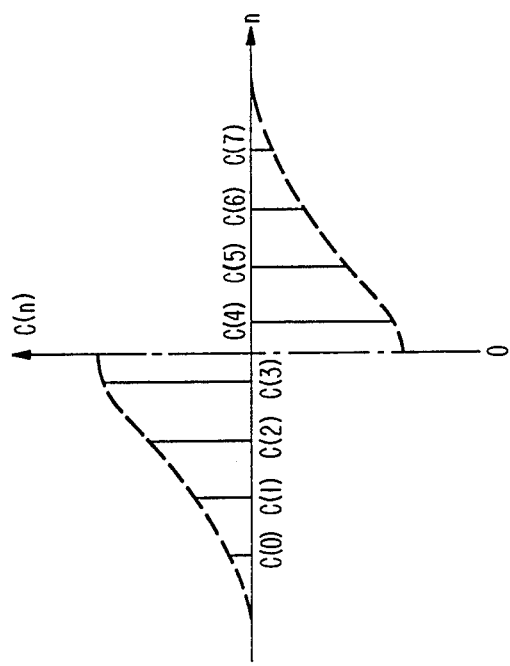
FIG. 2 illustrates a typical impulse response sequence of an antisymmetrical, linear-phase FIR filter.

The processing overhead that is incurred in FIR filter applications is reduced considerably by taking advantage of either the odd or even symmetry of the tap coefficients of such filters.

Specifically, in our arrangement the number of multiplications that are performed to generate the impulse response of a linear-phase FIR filter is reduced by a factor of 2 over more conventional arrangements by, in accordance with the invention, combining those signal components having tap coefficients of the same magnitude and then multiplying each such combination by one of its tap coefficients. The results are then accumulated in conventional fashion. In the case where the impulse response of the FIR filter has even symmetry, for example, the impulse response of a low-pass FIR filter, the combination is formed by adding those signals having coefficients of the same magnitude. In the case where the impulse response has odd symmetry, for example, the impulse response of a bandpass FIR filter, the combination is formed by taking the difference between those signals having coefficients of the same magnitude. The combinations formed in the former case are herein referred to as the elements $P_n$ of a P vector (where $n = 0, 1, 2, 3, \ldots k$) and the combinations formed in the latter case are herein referred to as the elements $Q_n$ of a Q vector, in which the length of each of the P and Q vectors is one-half the length of the original tap coefficient vector. The response of a linear-phase FIR filter having even (odd) symmetry is then generated by multiplying each element of the P (Q) vector by its respective tap coefficient and accumulating the results thereof. The response may then be outputted for further signal processing or stored in memory, for example, a RAM memory.

Advantageously, an arrangement embodying the invention can also be used to generate the impulse response of an FIR filter having a completely arbitrary frequency response (i.e., a nonlinear phase, nonsymmetrical impulse response). In this case, the required number of multiplications is the same as in prior art arrangements. Thus, a DSP implemented in accordance with the invention may be programmed to generate the impulse response of either (a) a linear-phase FIR filter, in which case the number of multiplications is reduced by a factor of 2 or (b) an arbitrary FIR filter, in which case the number of multiplications is not reduced.

We turn now to a discussion of the theoretical underpinnings of the invention.

The basic structure of an FIR filter typically consists of a chain of delay stages (for example, registers) for storing digital samples of a signal and at least one multiplier circuit. The digital samples contained in the delay stages are multiplied by respective coefficients and the results are summed together to generate a digitally filtered version of the stored samples. When the summation is completed, each sample is shifted down the chain by one position to the next delay stage, thereby preparing the first delay stage in the chain to recieve the latest digital sample of the signal. Each digital sample thus propagates through each stage of the filter. The impulse response of such a filter may be mathematically stated by the following equation:

$$y(n) = \sum_{k=0}^{N-1} C(k)x(n-k) \qquad (1)$$

Equation 1 may be expanded into the following series for an eight-stage FIR filter:

$$y(n) = C(0)x(n) + C(1)x(n-1) + C(2)x(n-2) + C(3)x(-n-3) + C(4)x(n-4) + C(5)x(n-5)) + C(6)x(n-6) + C(7)x(n-7) \qquad (2)$$

Figure 1:
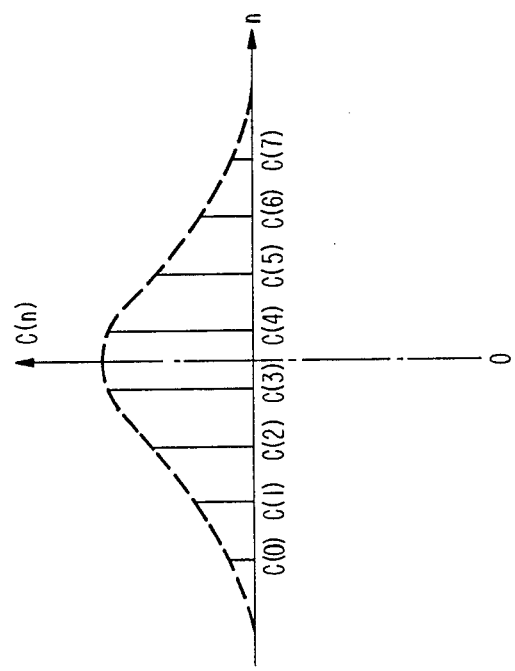
FIG. 1 illustrates a typical impulse response sequence of a symmetrical, linear-phase FIR filter.

Briefly referring to FIG. 1, there is shown one possible impulse response sequence of an even (symmetrical), linear-phase FIR filter. It is seen from FIG. 1 that the magnitudes of the tap coefficients are mirror images of each other about the center of the response, i.e., $C0=C7$, $C1=C6$, $C2=C5$, and so on. Equation 2 may be rearranged to take advantage of such symmetry as follows:

$$y(n) = C(0)[x(n)+x(n-7)] + C(1)[x(n-1)+x(n-6)] + C(2)[x(n-2)+x(n-5)] + C(3)[x(n-3)[x(n-3) + x(n-4)] \qquad (3)$$

It is seen from equation 3 that each coefficient, such as $C(0)$, is now the coefficient for a pair of signals, such as $x(n)$ and $x(n-7)$, rather than being the coefficient for just one signal. Stated a little differently, the samples are paired in accordance with the time that they occur about a center of a sequence of such samples, i.e., the most recent sample is paired with the $m^{th}$ previous sample of the sequence, the next most recent sample is paired with the $(m^{th}-1)^{st}$ previous sample of the sequence, etc. Thus, the number of multiplications that need to be performed to generate $y(n)$ using equation 3 is one-half the number of multiplications that need to be performed using equation 2. The terms within the brackets are the elements of the aforementioned P vector, which are generated as a result of summing the respective signal samples $x(n)$.

The approach taken to yield equation 3 may also be used in the case of an odd (antisymmetrical), linear-phase FIR filter. For example, FIG. 2 shows one possible impulse response sequence of such a filter, in which the values of the tap coeficients are also mirror images of each other, respectively, but of opposite sign. Accordingly, equation 2 may also be rearranged to reduce the number multiplications for an antisymmetrical linear-phase FIR filter as follows:

$$y(n) = C(0)[x(n)-x(n-7)] + C(1)[x(n-1)-x(n-6)] + C(2)[x(n-2)-x(n-5)] + C(3)[x(n-3)-x(n-4)] \qquad (4)$$

The terms within the brackets of equation 4 are the elements of the aforementioned Q vector, which are generated as a result of subtracting the respective signal samples. Thus, equations 3 and 4 may be rewritten in terms of the elements of the P and Q vectors, respectively, as follows:

$$y(n) = C(0)P(0) + C(1)P(1) + C(2)P(2) + C(3)P(3) \qquad (5)$$

and $$y(n) = C(0)Q(0) + C(1)Q(1) + C(2)Q(2) + C(3)Q(3) \qquad (6)$$

Thus it is seen from equations 5 and 6 that only four multiplications need to be performed to generate the response of a linear-phase FIR filter having eight taps when the repsonse is to be either symmetrical or antisymmetrical.

As mentioned above, the impulse response of an nonsymmetrical nonlinear-phase FIR filter may be generated by multiplying the P and Q signal vectors by their respective tap coefficients and accumulating the results thereof. This may be shown mathematically by algebraically manipulating equation 1 to present it in the following form:

$$y(n) = \frac{1}{2} \sum_{k=0}^{\frac{N}{2}-1} [C(k) - C(N-1-k)][x(n-k) - x(n-(N-1-k))] + \frac{1}{2} \sum_{k=0}^{\frac{N}{2}-1} [C(k) + C(N-1-k)][x(n-k) + x(n-(N-1-k))] \qquad (7)$$

Thus, for a symmetrical, linear-phase FIR filter, in which $C(k)=C(N-1-k)$, the first half of equation 7 drops out since it equals zero, thereby leaving the second half of the equation which defines the Pn signal vectors. Similarly, for an antisymmetrical, linear-phase FIR filter, in which $C(k)=-C(N-1-k)$, the second half of equation 7 drops out since it is equal to zero, thereby leaving the first half of equation intact which defines the Qn signal vectors. For an nonsymmetrical, nonlinear-phase FIR filter both halves of equation 7 remain intact since $C(k) \neq C(N-1-k)$ and $C(k) \neq -C(N-1-k)$. Accordingly, the response of the latter filter, in order to be generated, must use both the Pn and Qn signal vectors. QED.

Figure 3:
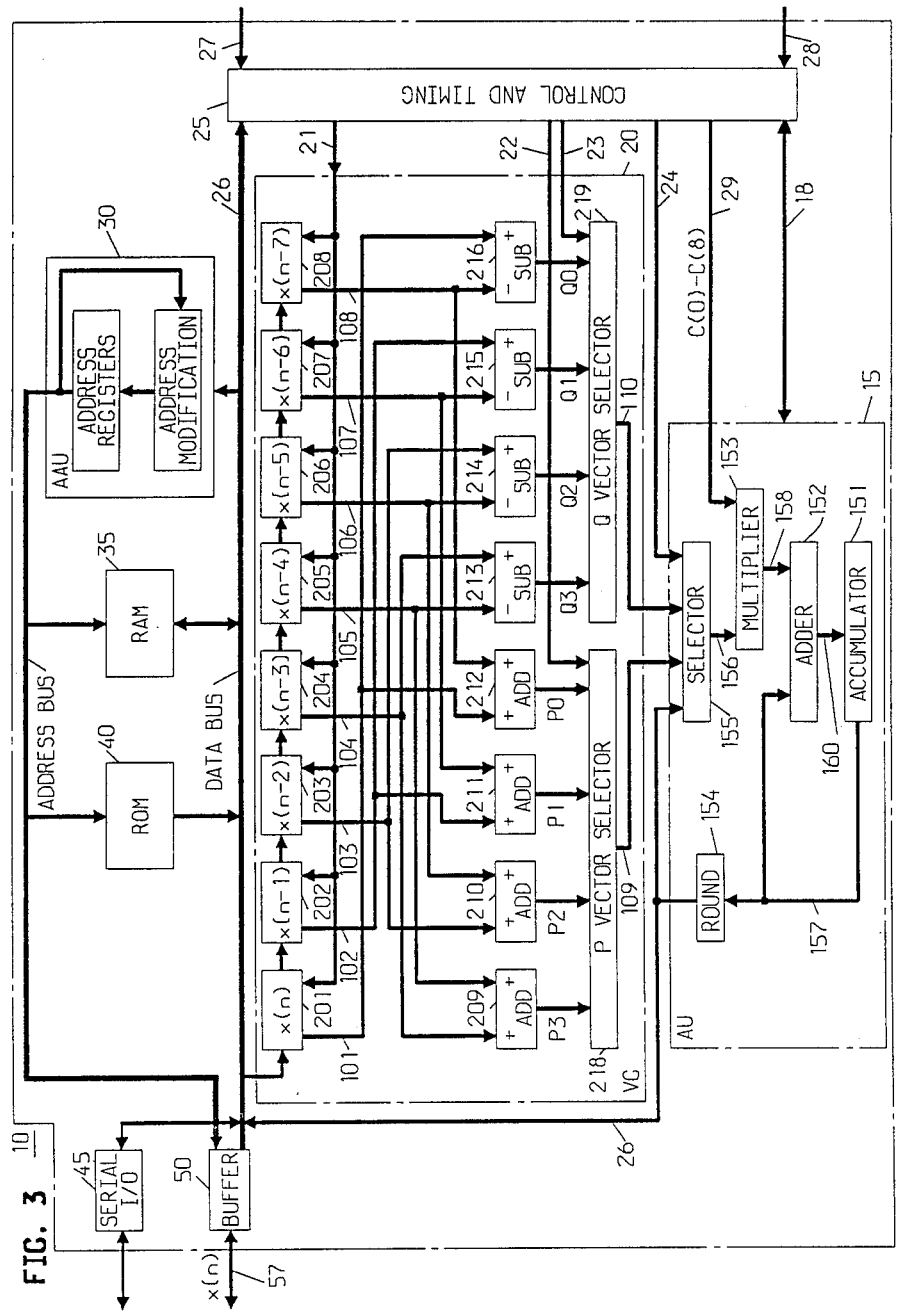
FIG. 3 illustrates a digital signal processor in which the present invention is illustratively implemented.

Referring now to FIG. 3, there is shown an illustrative example of a DSP arranged to implement the invention. A DSP of this type is disclosed in *The Bell System Technical Journal*, Sept., 1981, Vol. 60, No. 7, Part 2, pp. 1431–1462, which is hereby incorporated by reference. As will be discussed below, DSP 10 includes vector generator 20.

DSP 10 is a synchronous system in which signals, representing either program instructions or data, are passed between various sections of DSP 10, such as arithmetic unit (AU) 15, vector generator (VG) 20, control circuit 30, RAM 35, ROM 40, via 20-bit bus 26. Synchronization between the various sections is achieved by distributing thereto a master clock signal and synchronization signal received from an external circuit (not shown) via leads 27 and 28.

In particular, RAM 35 is used for the storage of variable data, such as data inputted via either buffer 50 or serial I/O interface circuit 45. ROM 40 is used for the storage of program instructions and fixed data. Arithmetic address unit (AAU) 30 generates addresses for RAM 35 and ROM 40 and performs post modifications on such memory addresses, such as adding two memory addresses together to form another address, the addresses being received from control circuit 25 via bus 26. Control circuit 25 decodes and operates on the aforementioned program instructions and coordinates the various sections of DSP 10 in the processing of data signals arriving over bus 26 as well as distributing the aforementioned master clock and synchronization signals to those sections.

Normally, in order to generate the response of, for example, an n-stage linear-phase FIR filter, a DSP performs in multiplications. However, by adding vector generator 20 to the architecture of DSP 10, the number of multiplications is reduced by a factor of 2.

In particular, vector generator 20 includes multibit registers 201 through 208 for storing a sequence of digital samples x(n) through x(n−7) of the signal being processed, such samples being recieved from an external sampling circuit (not shown) via bus 57. The latest of such samples, x(n), is stored in register 201, the next-to-the-latest is stored in register 202, and so on. When the response of the filter has been generated, control circuit 25 passes a shift signal to each of the registers via lead 21, which causes the contents of each register to be shifted from left to right to the next register in the chain, thereby preparing register 201 for receipt of the next digital sample.

When the next digital sample is received from the external sampling circuit, it is stored in register 201 and that sample along with the samples stored in registers 202 through 208 are supplied to adder circuits 209 through 212 and subtractor circuits 213 through 216 via buses 101 through 108, respectively. It is seen from FIG. 3 that busses 101 through 108 are connected to respective inputs of adder 212 and subtractor 216. Thus, adder 212 and subtractor 216 generate signal vector elements P0 and Q0, respectively, using the digital signals x(n) and x(n−7) that they receive from registers 201 and 208. Similarly, adder 211 and subtractor 215 generate signal vector elements P1 and Q1, respectively, using the digital signals x(n−1) and x(n−6) that they receive from registers 202 and 207. The remaining digital samples, i.e., x(n−2) through x(n−5) are supplied to adders 209 and 210 and to subtractors 213 and 214 in the manner shown in FIG. 3 to generate signal vector elements P3, P2, Q3 and Q2, respectively.

In the illustrative embodiment of the invention, it is assumed that selector circuits 218 and 219 are under the control of a program that is executed by control circuit 25, the program being stored in ROM 40. The program in this instance should be designed to enable either selector 218 or 219 when the response of a symmetrical or antisymmetrical, linear-phase FIR filter is required, respectively. The program should also be designed to enable both selectors when the response of a nonsymmetrical, arbitrary FIR filter is required. When selector 218 (219) is enabled via lead 22 (23) it passes signal vector elements P0 through P3 (Q0 through Q3) one at a time to selector 155 via bus 109 (110). In the case of a nonsymmetrical filter, the P vector elements and then the Q vector elements would be passed one at a time to selector 155, or vice-versa.

Selector 155 responsive to signals outputted by control circuit 25 via bus 24 supplies the digital signals appearing on either bus 26, bus 109 or bus 110 to multiplier circuit 153. Multiplier circuit 153, in turn, multiplies the signals appearing on bus 156 by the signals appearing on bus 29 and outputs the result to adder circuit 152 via bus 158. For example, upon receipt of a signal vector element, such as one of the elements P0 through P3, multiplier 153 multiplies the element by its respective constant (C(0), C(1), etc.) that is received via bus 29, each such constant being represented by a particular pattern of digital signals. Adder circuit 152, in turn, adds the result of the multiplication with the contents of accumulator 151 and stores the new accumulation in accumulator 151 via bus 157. This process continues until the last of either the P vector elements or the Q vector elements has been multiplied by its respective constant and the results thereof passed to adder 152 for accumulation with the prior results to generate the response of the desired filter. When the digital filtered representation of the input samples is generated, it is then supplied to data bus 26 via rounding circuit 154, the response then being either stored in RAM 35 or passed to bus 57 for external processing.

Rounding circuit 154 "rounds off" the multibit accumulation that it receives via bus 157 to a predetermined number of bits before passing the result to bus 26. For example, if accumulator 151 happens to be illustratively 40 bits wide and bus 26 happens to be illustratively a 20-bit bus, then the 40-bit output from accumulator 151 is truncated to 20 bits by rounding circuit 154.

The foregoing is merely illustrative of the principles of the invention. Those skilled in the art will be able to devise numerous arrangements which, although not explicitly shown or described herein, embody those principles and are within its spirit and scope. For example, the signals contained in registers 201 through 208 could be multiplexed to a single adder circuit and a single subtractor circuit, thereby eliminating the need to employ a plurality of adder circuit 209 through 212 and a plurality of subtractor circuits 213 through 216. Further, signal samples x(0) through x(n−7) could be stored in memory, such as RAM 35, and unloaded therefrom as required, rather than being stored in registers 201 through 208, thereby eliminating the need for those registers.

What is claimed is:

1. A linear-phase finite impulse response digital filter comprising
   means for storing a plurality of filter tap coefficients each having a predetermined magnitude,
   means for receiving a sequence of digital samples of a signal, each of said samples being associated with a respective one of said coefficients,
   means for combining said samples into pairs of samples such that the coefficients associated with the samples in a pair of samples are of equal magnitude, and
   means for generating and outputting a digitally filtered representation of said samples as a function of each of said pairs of samples and the magnitude of one of their respective coefficients, said filtered representation being symmetrical when the samples in each of said pairs of samples are summed and being antisymmetrical when one sample is subtracted from the other.

2. The filter set forth in claim 1 wherein said generating and outputting means further includes means for generating said representation as a function of both of said symmetrical and antisymmetrical representations when said filtered representation is to be nonsymmetrical.

3. A linear-phase finite impulse response digital filter comprising,
   means for storing a plurality of filter tap coefficients each having a predetermined magnitude,
   means for recieving a sequence of m digital samples of a signal, where $m \geq 1$, and
   means for generating and outputting a digitally filtered representation of said received samples by (a) combining said samples into pairs of samples such that the most recent sample is paired with the $m^{th}$ previous sample of said sequence, the next most recent sample is paired with the $(m-1)^{st}$ previous sample of said sequence, etc., (b) multiplying each of said pairs of samples by a respective one of said coefficients, and (c) accumulating the product of each such multiplication, said means for generating and outputting being arranged to sum said samples in each of said pairs of samples when said filtered representation is to be symmetrical and to subtract one sample from the other in each of said pairs of samples when said filtered representation is to be antisymmetrical.

4. The filter set forth in claim 3 wherein said filtered representation is nonsymmetrical when said multiplications include the pairs of samples that are summed and the pairs of samples that are subtracted.

5. A linear-phase finite impulse response digital filter comprising means for storing a plurality of filter tap coefficients each having a predetermined magnitude, means for receiving a sequence of m samples of a signal, where $m \geq 1$, means for generating a plurality of signal vector elements from predetermined pairs of said samples, said pairs of samples being formed such that the most recent sample is paired with the $m^{th}$ previous sample, the next most recent sample is paired with the $(m-1)^{st}$ previous sample, etc., and means for generating and outputting a filtered representation of said received samples by multiplying each of said signal vector elements by a respective one of said coefficients and accumulating the product of each such multiplication.

6. The filter set forth in claim 5 wherein said plurality of signal vector elements includes a first group and a second group of signal vector elements, said first group being generated by adding the samples in each of said pairs of samples and the second group being generated by subtracting one sample from the other in each of said pairs of samples.

7. The filter set forth in claim 6 wherein said filtered representation is symmetrical when said signal vector elements are said first group of elements and is antisymmetrical when they are said second group elements.

8. The filter set forth in claim 6 wherein said filtered representation is nonsymmetrical when said signal vector elements include said first and second groups of elements.

* * * * *